(12) United States Patent
Chang et al.

(10) Patent No.: US 9,245,763 B2
(45) Date of Patent: Jan. 26, 2016

(54) MECHANISMS FOR FORMING PATTERNS USING MULTIPLE LITHOGRAPHY PROCESSES

(71) Applicant: Taiwan Semiconductor Manufacturing Company, Ltd., Hsin-Chu (TW)

(72) Inventors: Shih-Ming Chang, Zhubei (TW); Ming-Feng Shieh, Yongkang (TW); Chih-Ming Lai, Hsinchu (TW); Ru-Gun Liu, Zhubei (TW); Tsai-Sheng Gau, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 40 days.

(21) Appl. No.: 14/210,032

(22) Filed: Mar. 13, 2014

(65) Prior Publication Data

US 2015/0262830 A1   Sep. 17, 2015

(51) Int. Cl.
*H01L 21/44* (2006.01)
*H01L 21/308* (2006.01)
(Continued)

(52) U.S. Cl.
CPC ...... *H01L 21/3081* (2013.01); *H01L 21/02046* (2013.01); *H01L 21/02052* (2013.01); *H01L 21/02054* (2013.01); *H01L 21/3086* (2013.01); *H01L 21/30604* (2013.01)

(58) Field of Classification Search
CPC ... H01L 21/308; H01L 21/467; H01L 21/475; H01L 21/426; H01L 21/762; H01L 21/02126; H01L 21/02332; H01L 21/02348; H01L 21/0228; H01L 21/02274; H01L 21/28194; H01L 28/556; H01L 21/28079; H01L 21/31116; H01L 21/31138; H01L 21/3212; H01L 21/3105; C23C 16/277
USPC ......... 438/700, 680, 692, 706, 745, 679, 311, 438/474, 475, 552, 602, 603, 604, 746, 786, 438/942; 257/E21.006, E21.023, E21.058, 257/E21.091, E21.126, E21.127, E21.17, 257/E21.218, E21.227, E21.231, E21.267, 257/E21.304, E21.311, E21.319, E21.332, 257/E21.347
See application file for complete search history.

(56) References Cited

U.S. PATENT DOCUMENTS 2,290,317 A   7/1942   Deakin
2,352,188 A   6/1944   Farrell
(Continued)

FOREIGN PATENT DOCUMENTS

JP   2005-293097   10/2005
JP   2006-189986    7/2006

OTHER PUBLICATIONS

U.S. Appl. No. 14/334,904, filed Jul. 18, 2014, by inventors Shih-Ming Chang, Ming-Feng Shieh, Chih-Ming Lai, Ru-Gun Liu, and Tsai-Sheng Gau for "Mechanisms for Forming Patterns Using Multiple Lithography Processes," 40 pages of text, 19 pages of drawings.
(Continued)

*Primary Examiner* — David Nhu
(74) *Attorney, Agent, or Firm* — Haynes and Boone, LLP

(57) ABSTRACT

The present disclosure provides a method for forming patterns in a semiconductor device. In accordance with some embodiments, the method includes providing a substrate, a patterning-target layer over the substrate, and a hard mask layer over the patterning-target layer; forming a first pattern in the hard mask layer; removing a trim portion from the first pattern in the hard mask layer to form a trimmed first pattern; forming a first resist layer over the hard mask layer; forming a main pattern in the first resist layer; and etching the patterning-target layer using the main pattern and the trimmed first pattern as etching mask elements to form a final pattern in the patterning-target layer. In some embodiments, the final pattern includes the main pattern subtracting a first overlapping portion between the main pattern and the trimmed first pattern.

20 Claims, 16 Drawing Sheets

(51) Int. Cl.
*H01L 21/02* (2006.01)
*H01L 21/306* (2006.01)

(56) References Cited

U.S. PATENT DOCUMENTS

| | | | |
|---|---|---|---|
| 4,577,744 | A | 3/1986 | Doucet |
| 4,969,549 | A | 11/1990 | Eglise |
| 6,550,600 | B2 | 4/2003 | Faes et al. |
| 8,039,179 | B2 * | 10/2011 | Shieh et al. ............ 430/5 |
| 8,202,681 | B2 | 6/2012 | Lin et al. |
| 8,728,332 | B2 | 5/2014 | Lin et al. |
| 8,822,243 | B2 | 9/2014 | Yan et al. |
| 8,987,142 | B2 * | 3/2015 | Lee et al. ............ 438/703 |
| 2006/0091468 | A1 | 5/2006 | Liaw |
| 2011/0281208 | A1 | 11/2011 | Lin et al. |
| 2012/0278776 | A1 | 11/2012 | Lei et al. |
| 2013/0295769 | A1 | 11/2013 | Lin et al. |
| 2013/0320451 | A1 | 12/2013 | Liu et al. |
| 2014/0193974 | A1 | 7/2014 | Lee et al. |
| 2014/0215421 | A1 | 7/2014 | Chen et al. |
| 2014/0242794 | A1 | 8/2014 | Lin et al. |
| 2014/0264760 | A1 | 9/2014 | Chang et al. |
| 2014/0264899 | A1 | 9/2014 | Chang et al. |
| 2014/0273442 | A1 | 9/2014 | Liu et al. |
| 2014/0273446 | A1 | 9/2014 | Huang et al. |

OTHER PUBLICATIONS

U.S. Appl. No. 14/334,958, filed Jul. 18, 2014, by inventors Shih-Ming Chang for "Mechanisms for Forming Patterns Using Multiple Lithography Processes," 30 pages of text, 11 pages of drawings.

U.S. Appl. No. 14/457,282, filed Aug. 12, 2014, by inventors Shih-Ming Chang for "Mechanisms for Forming Patterns Using Multiple Lithography Processes," 29 pages of text, 12 pages of drawings.

* cited by examiner

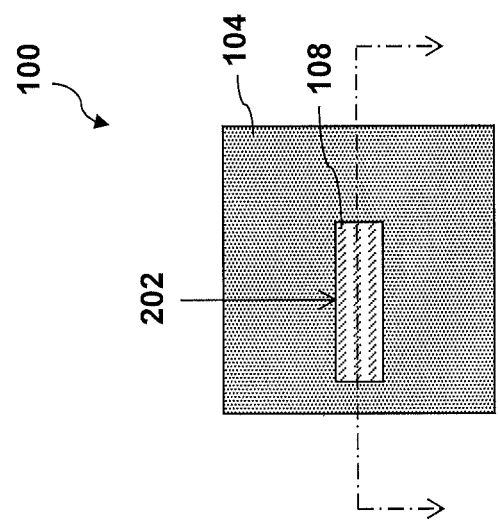
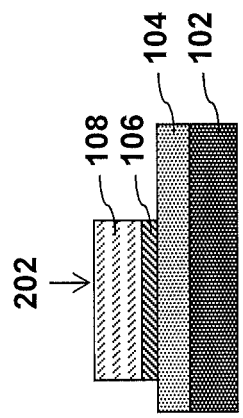
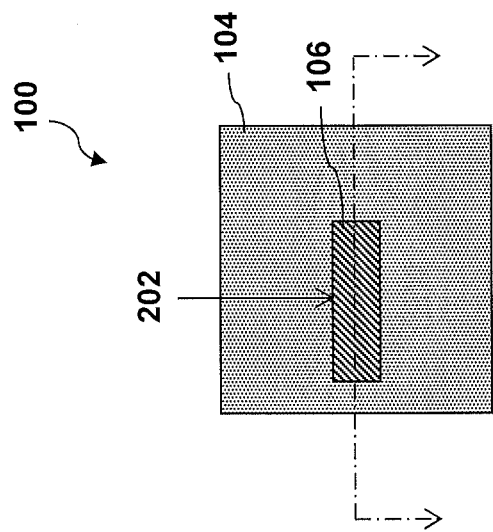
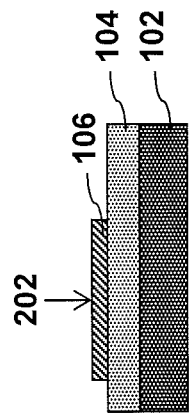

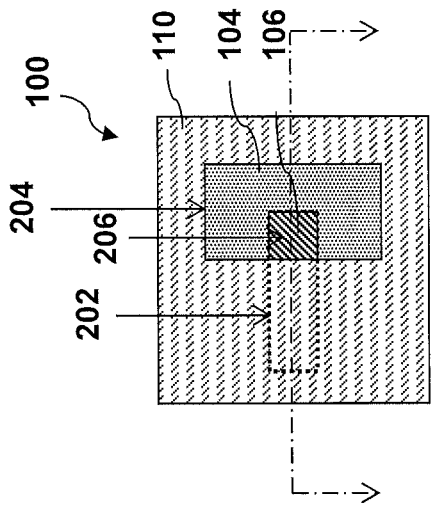
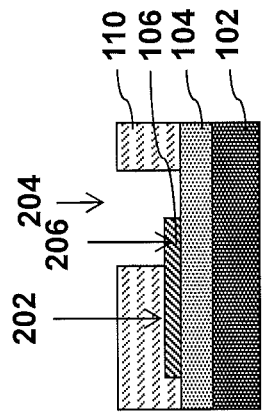
FIG. 6A
FIG. 6B
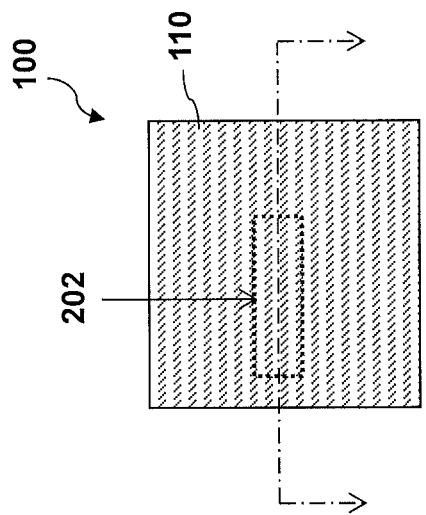
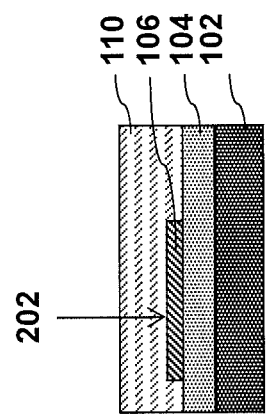
FIG. 5A
FIG. 5B

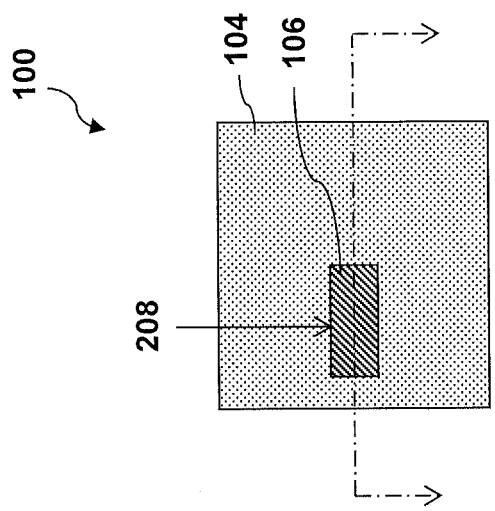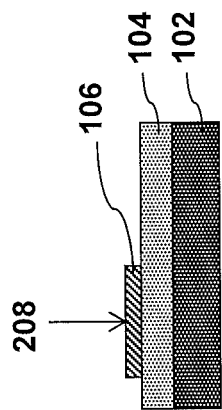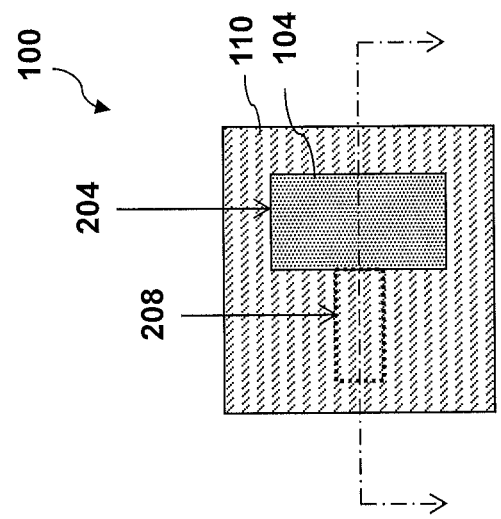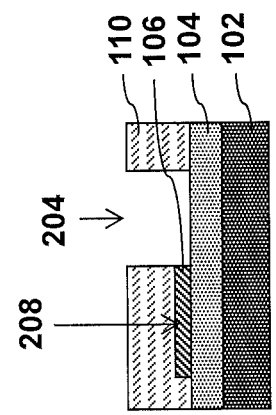

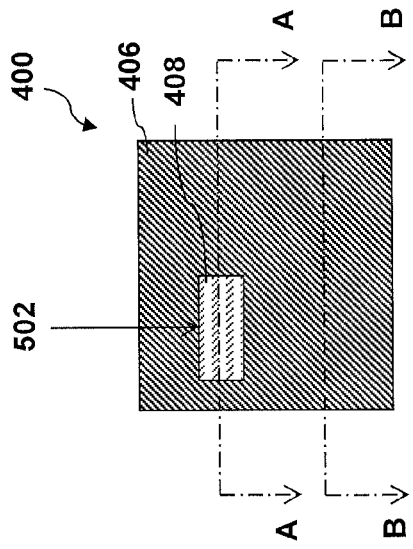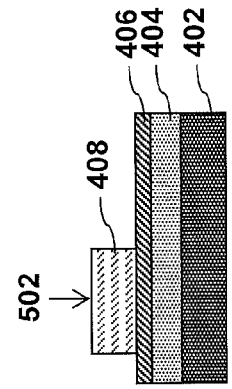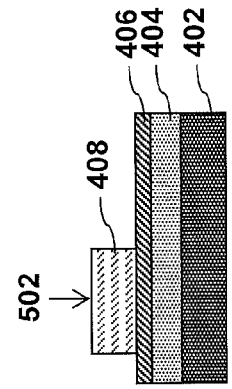
FIG. 16A
FIG. 16B
FIG. 16C
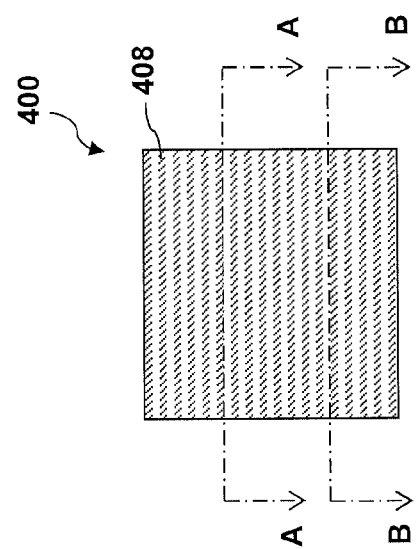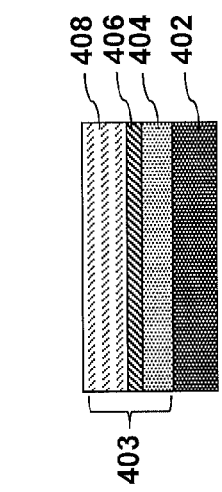
FIG. 15A
FIG. 15B
FIG. 15C

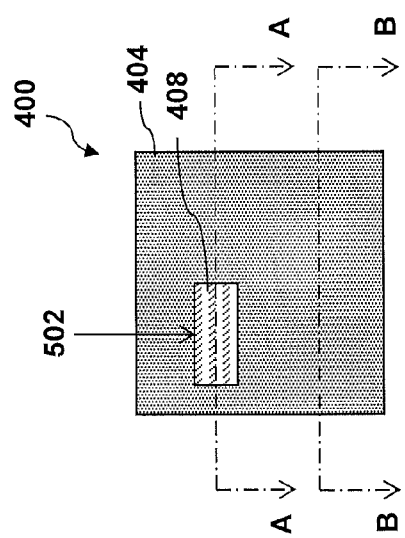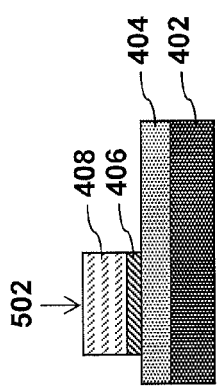
FIG. 17A  FIG. 17B  FIG. 17C
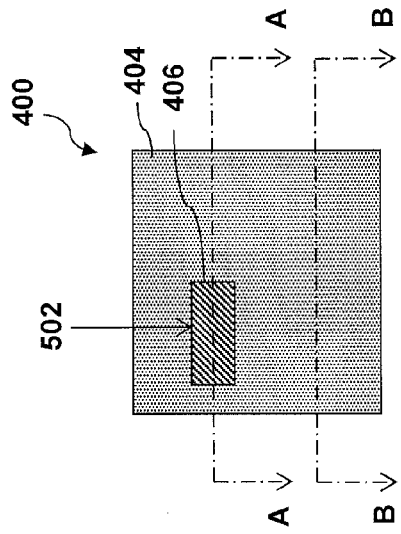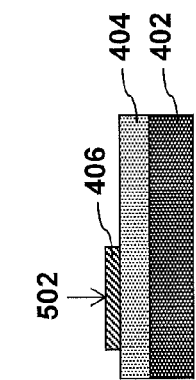
FIG. 18A  FIG. 18B  FIG. 18C

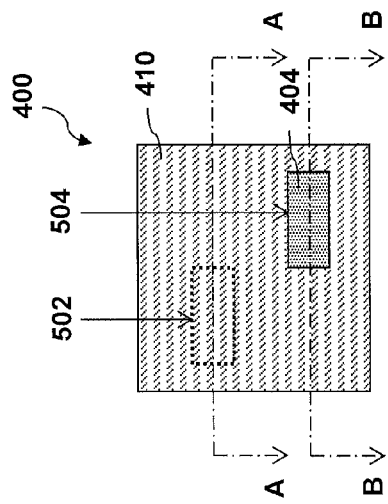
FIG. 19A
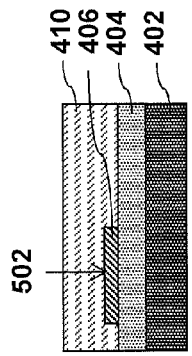
FIG. 19B
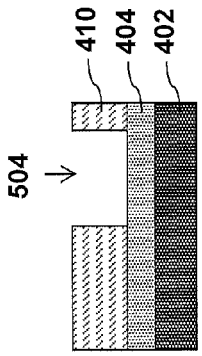
FIG. 19C
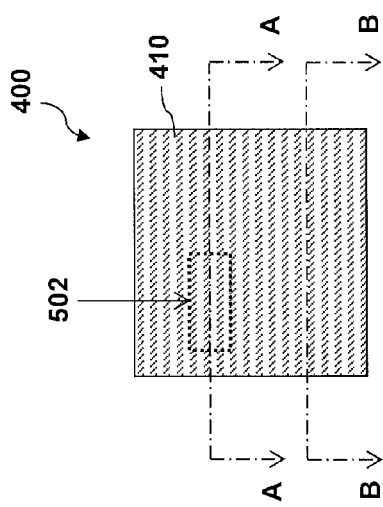
FIG. 20A
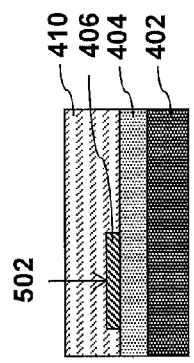
FIG. 20B
FIG. 20C

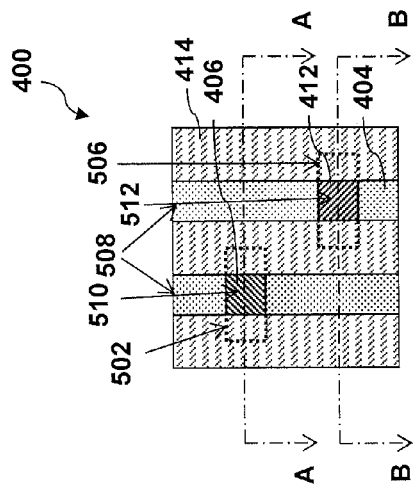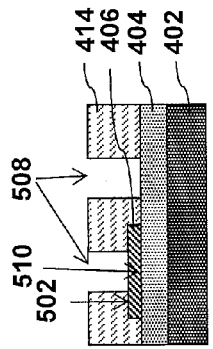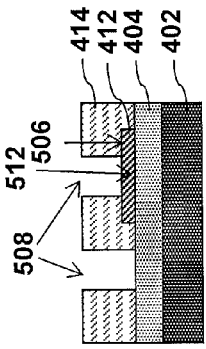
FIG. 24A  FIG. 24B  FIG. 24C
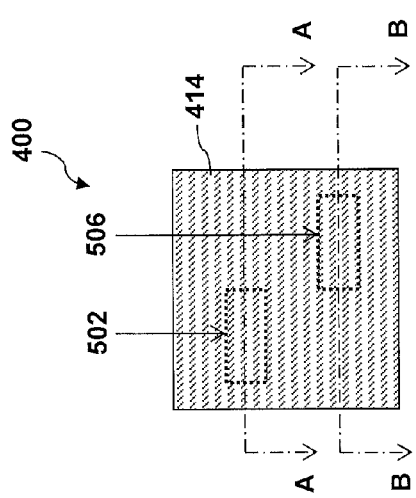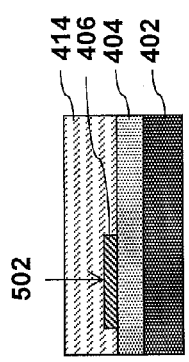
FIG. 23A  FIG. 23B  FIG. 23C

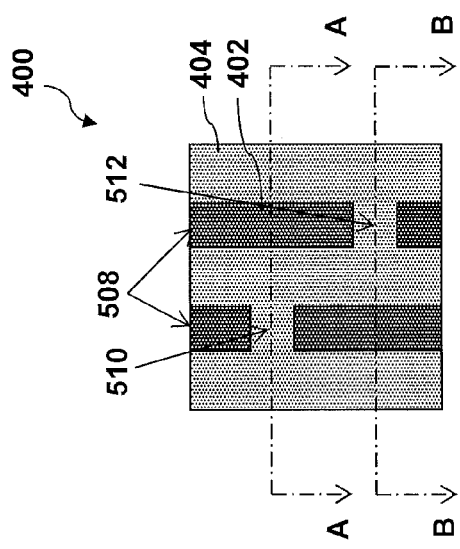
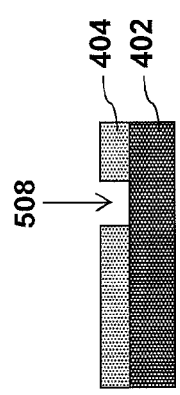
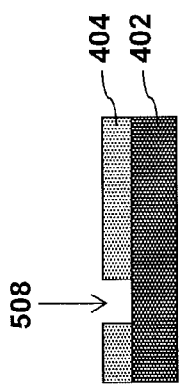
FIG. 27A
FIG. 27B
FIG. 27C

MECHANISMS FOR FORMING PATTERNS USING MULTIPLE LITHOGRAPHY PROCESSES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In the course of these benefits, efforts have been made to develop fabrication methods to realize the desire for smaller feature sizes. For example, methods have been developed to reduce the pitch of features on a substrate without changing the photolithography technology used. However, current methods have not been satisfactory in all respects. For example, process windows of critical dimension (CD) uniformity control and process flexibility of forming special features may be not sufficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A, 12A, and 13A are top views of the semiconductor structure at various pattern formation steps constructed according to the method of FIG. 14, in accordance with some embodiments.

FIGS. 1B, 2B, 3B, 4B, 5B, 6B, 7B, 8B, 9B, 10B, 11B, and 12B are cross sectional views of the semiconductor structure along the dash lines of FIGS. 1A, 2A, 3A, 4A, 5A, 6A, 7A, 8A, 9A, 10A, 11A, and 12A respectively, in accordance with some embodiments.

FIGS. 15A, 16A, 17A, 18A, 19A, 20A, 21A, 22A, 23A, 24A, 25A, 26A, and 27A are top views of the semiconductor structure at various pattern formation steps constructed according to the method of FIG. 28, in accordance with some embodiments.

FIGS. 15B, 16B, 17B, 18B, 19B, 20B, 21B, 22B, 23B, 24B, 25B, 26B, and 27B are cross sectional views of the semiconductor structure along the dash lines A-A of FIGS. 15A, 16A, 17A, 18A, 19A, 20A, 21A, 22A, 23A, 24A, 25A, 26A, and 27A respectively, in accordance with some embodiments.

FIGS. 15C, 16C, 17C, 18C, 19C, 20C, 21C, 22C, 23C, 24C, 25C, 26C, and 27C are cross sectional views of the semiconductor structure along the dash lines B-B of FIGS. 15A, 16A, 17A, 18A, 19A, 20A, 21A, 22A, 23A, 24A, 25A, 26A, and 27A respectively, in accordance with some embodiments.

DETAILED DESCRIPTION

Figure 1A:
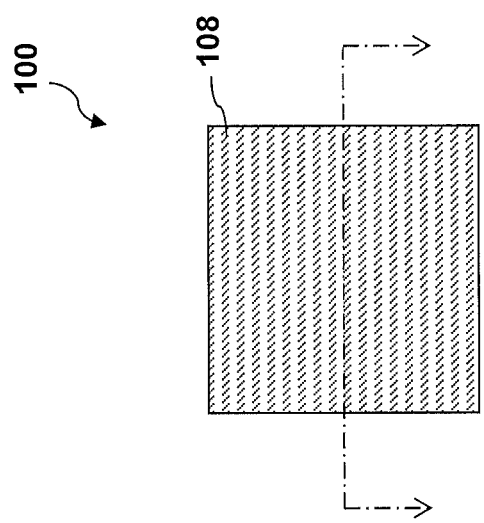

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Due to the limitations from the optics, resist materials, developing and/or etching techniques during the lithography patterning process, the developed pattern may not be able to include a feature with a size under the minimum constraints, such as a minimum line width. The developed pattern may also not be able to have dense feature(s) that are disposed from an adjacent feature for less than about a minimum pitch value. As obtained from a single lithography process, the developed pattern may have limitations on the complexity of the shapes. In addition, after exposing and developing, the pattern may have "rounding issues", where the edges and/or the corners of the features may appear to be round and/or unclear, instead of being sharp and clear as expected.

Figure 1B:
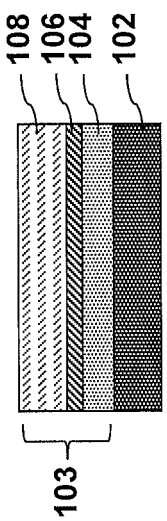

As illustrated in FIGS. 1A-1B, a substrate 102 and a film stack 103 are provided in a semiconductor structure 100. In some embodiments, the substrate 102 is a semiconductor substrate, such as a semiconductor wafer. The substrate 102 may include silicon in a crystalline structure. In some embodiments, the substrate 102 may include other elementary semiconductor, such as germanium; a compound semiconductor including silicon germanium, silicon carbide, gallium arsenide, indium arsenide, indium phosphide, and/or indium antimonide; an alloy semiconductor including SiGe, GaAsP, AlInAs, AlGaAs, GaInAs, GaInP, and/or GaInAsP; or combinations thereof. In some embodiments, the substrate 102 may be a silicon-on-insulator (SOI) substrate. The substrate 102 may further include additional features and/or material layers, such as various isolation features formed in the substrate. In some embodiments, the substrate 102 may include various doped regions, such as p-type doped regions and/or n-type doped regions configured and coupled to form various devices and functional features. All doping features may be achieved using a suitable process, such as ion implantation in various steps and techniques. In some embodiments, the substrate 102 may include other features, such as shallow trench isolation (STI). The substrate 102 may further include various material layers, such as gate material layers.

As shown in FIG. 1B, the film stack 103 includes a patterning-target layer 104 formed over the substrate 102, a hard mask layer 106 over the patterning-target layer 104, and a first resist layer 108 over the hard mask layer 106. In some embodiments, the patterning-target layer 104 is the layer where the final patterns are formed over the substrate 102. In some embodiments, the patterning-target layer 104 has a thickness in a range from about 5 nm to about 50 nm. In some embodiments, the patterning-target layer 104 is formed using one or more conventional processes known in the art such as, chemical vapor deposition (CVD), spin-on methods, sputtering, oxidation, physical vapor deposition (PVD), atomic layer deposition (ALD), atomic layer CVD (ALCVD), thermal oxidation, and/or other suitable processes. In some embodiments, the patterning-target layer 104 includes one or more dielectric materials, such as silicon oxide ($SiO_2$), and/or silicon nitride ($Si_3N_4$). In some embodiments, the patterning-target layer 104 also includes metallic materials. In some embodiments, the patterning-target layer 104 is an upper portion of the substrate 102.

Still referring to FIG. 1B, the hard mask layer 106 is formed over the patterning-target layer 104. The hard mask layer 106 is used to pattern, such as by etching, the patterning-target layer 104 as discussed later in detail in the present disclosure. In some embodiments, the hard mask layer 106 includes one or more dielectric materials, such as silicon oxide, silicon nitride, and/or silicon oxynitride (SiON). In some embodiments, the hard mask layer 106 includes titanium nitride (TiN). In some embodiments, the hard mask layer 106 has a thickness in a range from about 5 nm to about 50 nm. In some embodiments, the hard mask layer 106 is formed using one or more processes selected from the group consisting of CVD, PVD, ALD, spin-on method, sputtering, thermal oxidation, and a combination thereof.

As shown in FIGS. 1A-1B, in order to pattern the hard mask layer 106, so that the patterned hard mask layer 106 can be used as a mask to pattern the patterning-target layer 104, the first resist layer 108 is formed over the hard mask layer 106. In some embodiments, the first resist layer 108 is a photoresist layer including chemicals that are sensitive to light, such as UV light. In some embodiments, the first resist layer 108 can also be an electron-beam sensitive layer. In some embodiments, the first resist layer 108 is formed using a spin-on coating method. In some embodiments, the first resist layer 108 includes one or more organic polymer materials. In some embodiments, the first resist layer 108 has a thickness in a range from about 10 nm to about 100 nm.

Figure 2A:
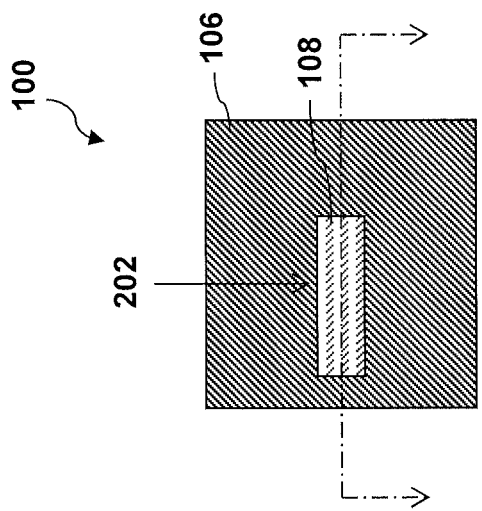
Figure 2B:
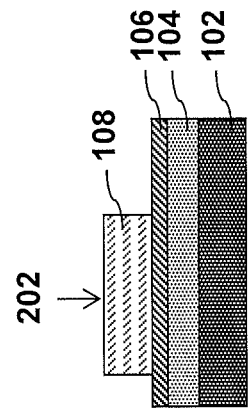

Referring to FIGS. 2A-2B, a lithography process is performed to the first resist layer 108 to form a first pattern 202. In some embodiments, the lithography process includes exposing the first resist layer 108 to a light source using a mask including the first pattern 202, performing post-exposure bake processes, and developing the first resist layer 108 to form the first pattern 202 as shown in FIGS. 2A-2B. In some embodiments, the first pattern may include an over-sized feature to be trimmed to form a feature included in the final pattern, so that the feature in the final pattern can have sharp and clear edges and is free of the "rounding issues".

Referring to FIGS. 3A-3B, the patterned first resist layer 108 is used as a mask to transfer the first pattern 202 to the hard mask layer 106. In some embodiments, the regions that are not covered by the patterned first resist layer 108 are removed using one or more etching processes, leaving the region(s) corresponding to the first pattern 202 remain in the hard mask layer 106 as shown in FIG. 3B. In some embodiments, the one or more etching processes include a selective dry etch process, such as a plasma etching process, a selective wet etching process, or a combination thereof. During the etching processes, the corresponding portions of the hard mask layer 106 are selectively etched, while the patterning-target layer 104 remains unetched. In some embodiments when the hard mask layer 106 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 106 includes titanium nitride, the etching process includes using an etching gas including at least chlorine ($Cl_2$) or any other suitable etching gases.

Referring to FIGS. 4A-4B, after transferring the first pattern 202 to the hard mask layer 106, the first resist layer 108 is removed. In some embodiments, the first resist layer 108 is removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 4B, the first pattern 202 is exposed in the hard mask layer 106 after removing the first resist layer 108.

Referring to FIGS. 5A-5B, a second resist layer 110 is formed over the patterning-target layer 104 and the patterned hard mask 106. In some embodiments, the second resist layer 110 is a photoresist layer including chemicals that are sensitive to light, such as UV light. In some embodiments, the second resist layer 110 can also be an electron-beam sensitive layer. In some embodiments, the second resist layer 110 is formed using a spin-on coating method. In some embodiments, the second resist layer 110 includes one or more organic polymer materials. In some embodiments, the second resist layer 110 has a thickness in a range from about 10 nm to about 100 nm. In some embodiments, the second resist layer 110 is substantially similar to the first resist layer 108.

Referring to FIGS. 6A-6B, a second pattern is formed in the second resist layer 110. In some embodiments, the second pattern includes an opening 204 formed in the second resist layer 110 to expose portions of the hard mask layer 106 and the patterning-target layer 104. In some embodiments, the opening 204 is formed using a lithography process. In some embodiments, the lithography process includes exposing the second resist layer 110 to a light source using a mask including a pattern of the opening 204, performing post-exposure bake processes, and developing the second resist layer 110 to form the opening 204 in the second resist layer 110 as shown in FIGS. 6A-6B.

In some embodiments, by forming the opening 204, a trim portion 206 in the hard mask layer 106 is exposed. In some embodiments as shown in FIGS. 6A-6B, the trim portion 206 corresponds to an overlapping portion where the opening 204 overlaps with the first pattern 202 in the hard mask layer 106. The trim portion 206 is formed to remove portion(s) from the first pattern 202 in the hard mask layer 106 in the following processes. Although the opening 204 is shown to be perpendicular to the first pattern 202 in FIGS. 6A-6B, the opening 204 can be designed and formed to be in parallel to the first pattern 202, or in a suitable angle relative to the first pattern 202. In some embodiments, the second pattern may include any other suitable features that can be formed using a lithography process.

Referring to FIGS. 7A-7B, the patterned second resist layer 110 is used as a mask to transfer the second pattern to the first pattern 202 in the hard mask layer 106. The exposed trim portion 206 of the first pattern 202 in the hard mask layer 106 of FIGS. 6B-6A is removed using one or more etching processes. In some embodiments, the one or more etching processes include a selective dry etch process, such as a plasma etching process, a selective wet etching process, or a combination thereof. During the etching processes, the corresponding portions of the hard mask layer 106 are selectively etched, while the patterning-target layer 104 remains unetched. In some embodiments when the hard mask layer 106 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 106 includes titanium nitride, the etching process includes using an etching gas including at least chlorine ($Cl_2$) or any other suitable etching gases. In some embodiments, the etching processes are substantially similar to the etching processes used to form the first pattern 202 in the hard mask layer 106 with reference to FIGS. 3A-3B. After removing the trim portion 206 from the hard mask layer 106, a trimmed first pattern 208 is formed in the hard mask layer 106.

Referring to FIGS. 8A-8B, after removing the trim portion 206 form the hard mask layer 106, the second resist layer 110 is removed. In some embodiments, the second resist layer 110 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 8B, after removing the second resist layer 110, the trimmed first pattern 208 is exposed.

As shown in FIGS. 8A-8B, the size of the trimmed first pattern 208 may be is less than the minimum line width. In some embodiments, by removing the trim portion 206, the trimmed first pattern 208 may include complex shapes, which cannot be fabricated using a single lithography process. In some embodiments, the edges and/or corners in the first pattern 202 with "rounding issues" as discussed earlier in the present disclosure may be removed by the trim portion 206.

Figure 9A:
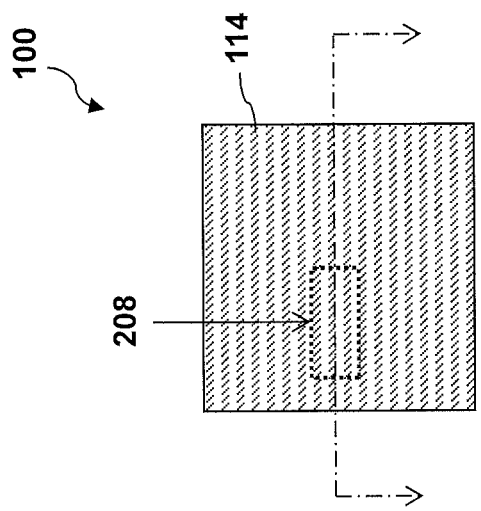
Figure 9B:
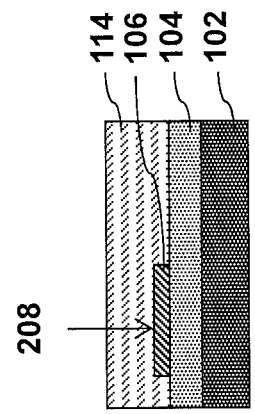

Referring to FIGS. 9A-9B, a third resist layer 114 is formed to cover the patterning-target layer 104 and the trimmed first pattern 208 in the hard mask layer 106. In some embodiments, the third resist layer 114 is a photoresist layer including chemicals that are sensitive to light, such as UV light. In some embodiments, the third resist layer 114 can also be an electron-beam sensitive layer. In some embodiments, the third resist layer 114 is formed using a spin-on coating method. In some embodiments, the third resist layer 114 includes one or more organic polymer materials. In some embodiments, the third resist layer 114 has a thickness in a range from about 10 nm to about 100 nm. In some embodiments, the third resist layer 114 is substantially similar to the first resist layer 108.

Figure 10A:
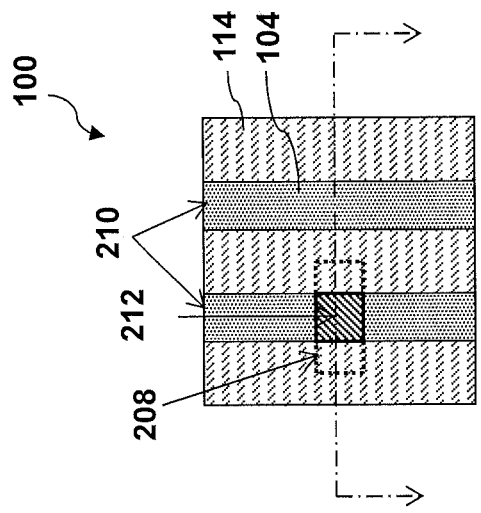
Figure 10B:
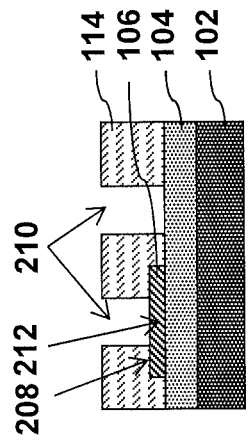

Referring to FIGS. 10A-10B, a main pattern is formed in the third resist layer 114. In some embodiments, the main pattern includes one or more trenches 210 formed in the third resist layer 114 to expose portions of the hard mask layer 106 and the patterning-target layer 104. In some embodiments, the trenches 210 are formed using a lithography process. In some embodiments, the lithography process starts from exposing the third resist layer 114 to a light source using a mask having the main pattern including the one or more trenches 210. The lithography process also includes performing post-exposure bake processes, and developing the third resist layer 114 to form the trenches 210 in the third resist layer 114 as shown in FIGS. 10A-10B. In some embodiments as shown in FIG. 10A, an overlapping portion 212 in the hard mask layer 106 is exposed after forming the trenches 210. In some embodiments, the overlapping portion 212 corresponds to the overlapping portion between the trenches 210 in the main pattern and the trimmed first pattern 208 as shown in FIGS. 10A-10B. In some embodiments, the main pattern may include any other suitable features that can be formed using a lithography process.

Figure 11A:
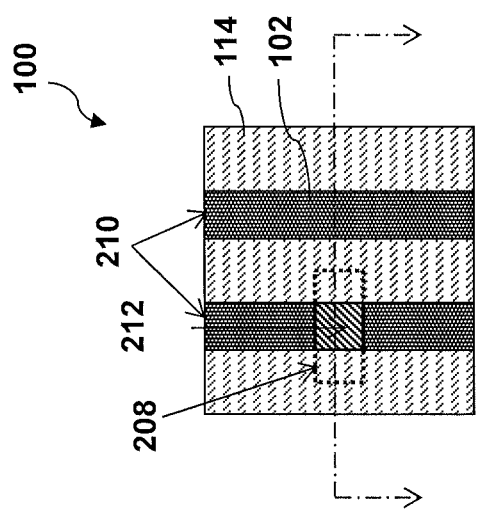
Figure 11B:
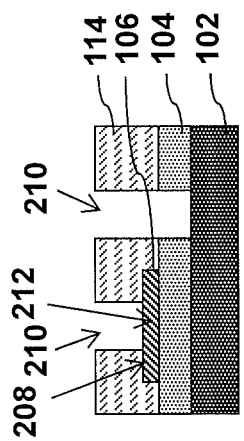

Referring to FIGS. 11A-11B, the patterned third resist layer 114 and the trimmed first pattern 208 are used as masks to transfer a final pattern to the patterning-target layer 104. In some embodiments, the final pattern includes the one or more trenches 210 in the main pattern subtracting the overlapping portion 212 in the hard mask layer 106. In some embodiments, the regions of the patterning-target layer 104 exposed by the trenches 210 and not covered by the trimmed first pattern 208 are removed using one or more etching processes. The region(s) of the patterning-target layer 104 in the trenches 210 that are covered by the trimmed first pattern 208, e.g., the overlapping portion 212, remain unetched as shown in FIG. 11B. In some embodiments, the one or more etching processes include a selective dry etch process, such as a plasma etching process, a selective wet etching process, or a combination thereof, so that the corresponding portions of the patterning-target layer 104 can be selectively etched, while the hard mask layer 106 remains unetched. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof.

Figure 12A:
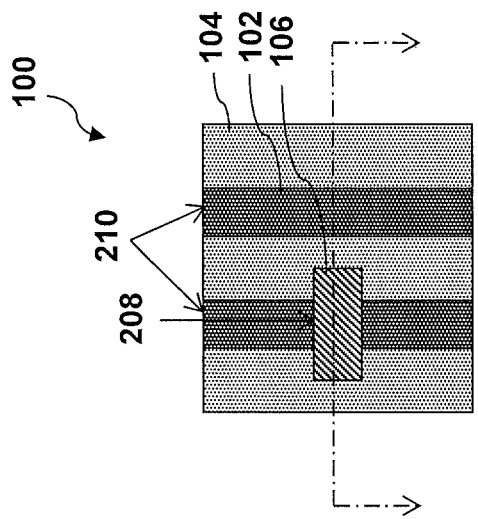
Figure 12B:
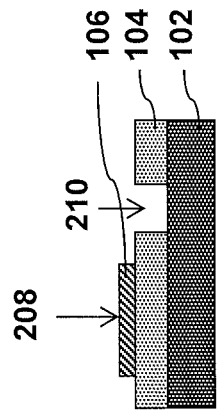

Referring to FIGS. 12A-12B, the third resist layer 114 is removed. In some embodiments, the third resist layer 114 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 12B, after removing the third resist layer 114, the trimmed first pattern 208 in the hard mask layer 106 is exposed. The trimmed first pattern 208 is disposed over the unetched regions of the patterning-target layer 104 as shown in FIGS. 12A-12B.

Figure 13A:
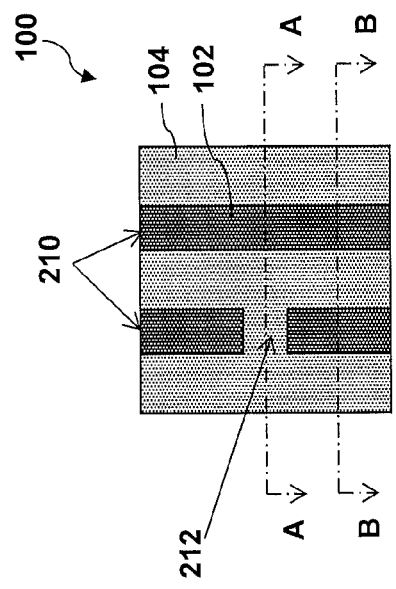
Figure 13B:
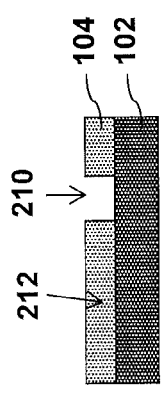
FIGS. 13B-13C are cross sectional views of the semiconductor structure along the dash lines A-A and B-B of FIG. 13A respectively, in accordance with some embodiments.
Figure 13C:
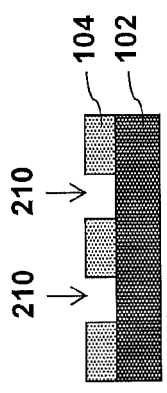

Referring to FIGS. 13A, 13B and 13C, the trimmed first pattern 208 in the hard mask layer 106 is removed. In some embodiments, the hard mask layer 106 is removed using a chemical mechanical polish (CMP) process. In some embodiments, the hard mask layer 106 is removed using one or more etching processes. The etching processes may include a selective dry etch process, such as a plasma etching process, a selective wet etching process, or a combination thereof. During the etching processes, the corresponding portions of the hard mask layer 106 can be selectively etched, while the patterning-target layer 104 remains unetched. In some embodiments when the hard mask layer 106 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 106 includes titanium nitride, the etching process includes using an etching gas including at least chlorine ($Cl_2$) or any other suitable etching gases.

As shown in FIGS. 13A-13C, the final pattern (F) in the patterning-target layer 104 includes one or more trenches 210 in the main pattern (M) subtracting the overlapping portion 212. In some embodiments as discussed earlier in the present disclosure, the overlapping portion 212 corresponds to the overlapping portion between the main pattern (M) and the trimmed first pattern 208. The trimmed first pattern 208 is formed by removing a trim portion 206, which is an overlapping portion between the first pattern 502 (P1) and the second pattern 204 (P2) from the first pattern 502 (P1). Therefore, the formation of the final pattern (F) can be illustrated using Equation 1:

$$F=M-(M\cap(P1-(P1\cap P2))) \qquad (1)$$

In some embodiments, by using multiple lithography processes as discussed in the present disclosure, a size of the final pattern may be less than the minimum pitch value. In some embodiments, the final pattern in the patterning-target layer 104 may include complex shapes which cannot be formed using a single lithography process. In some embodiments, the final pattern has sharp and clear edges and is free of "rounding issues".

Figure 14:
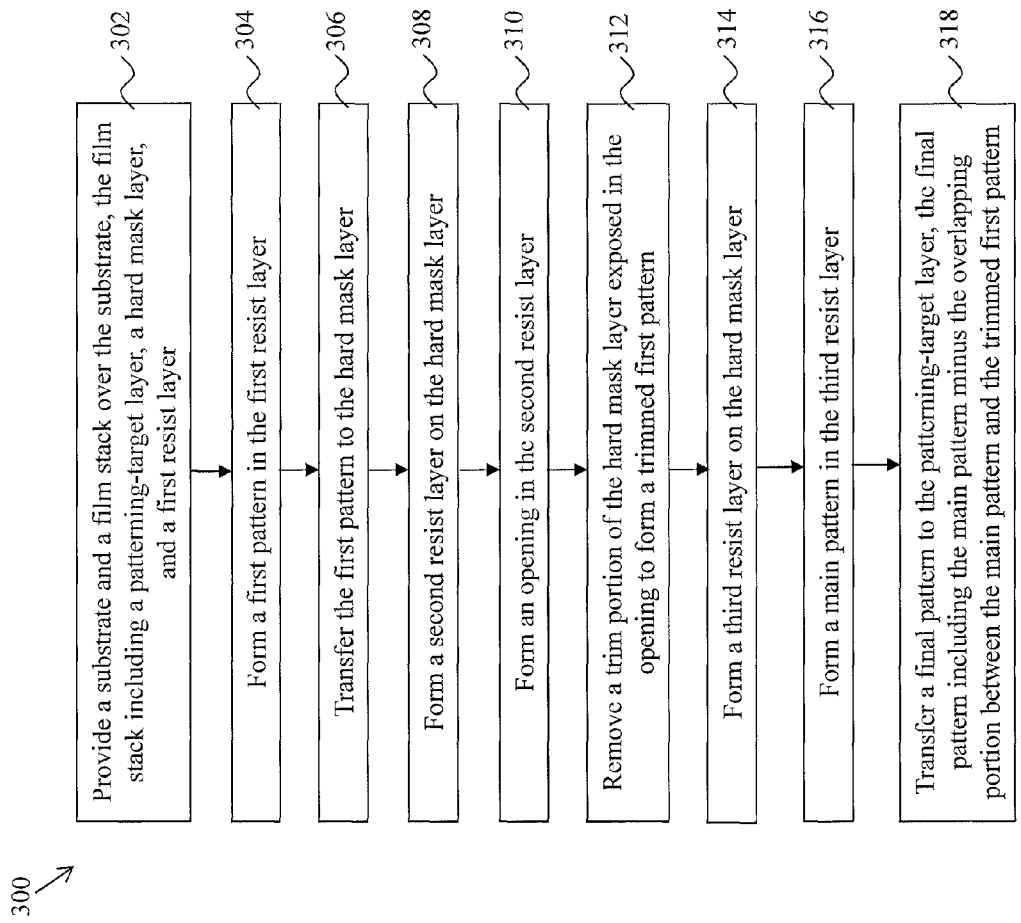
FIG. 14 is a flowchart showing a method of forming patterns using multiple lithography processes in the semiconductor structure, in accordance with some embodiments.

FIG. 14 illustrates a method 300 of forming patterns using multiple lithography processes in the semiconductor structure 100 as discussed with reference to FIGS. 1A-1B to 13A-13C. Method 300 starts from step 302 by providing the substrate 102 and the film stack 103. As shown in FIG. 1B, the film stack 103 includes the patterning-target layer 104 formed over the substrate 102, the hard mask layer 106 over the patterning-target layer 104, and the first resist layer 108 over the hard mask layer 106. In some embodiments, the patterning-target layer 104 and the hard mask layer 106 are formed by one or more processes selected from the group consisting of CVD, PVD, ALD, spin-on method, sputtering, thermal oxidation, and a combination thereof. In some embodiments, the first resist layer 108 is formed using a spin-on coating method.

Method 300 proceeds to step 304 by forming a first pattern 202 in the first resist layer 108 using a lithography process. In some embodiments, the lithography process includes exposing the first resist layer 108 to a light source, performing post-exposure bake processes, and developing the first resist layer 108.

Method 300 proceeds to step 306 by transferring the first pattern 202 to the hard mask layer 106. In some embodiments, the hard mask layer 106 is etched using the patterned first resist layer 108 as a mask. In some embodiments, the etching processes include a selective dry etch process, such as a plasma etching process, a selective wet etching process, or a combination thereof. During the etching processes, the corresponding portions of the hard mask layer 106 can be selectively etched, while the patterning-target layer 104 remains unetched. In some embodiments, the first resist layer 108 is then removed by a wet stripping process, a plasma ashing process, and/or other suitable methods.

Method 300 proceeds to step 308 by forming a second resist layer 110 on the patterned hard mask layer 106 as shown in FIGS. 5A-5B. In some embodiments, the second resist layer 110 is formed using a spin-on coating method.

Method 300 proceeds to step 310 by forming a second pattern in the second resist layer 110. In some embodiments, the second pattern includes an opening 204 as shown in FIGS. 6A-6B. In some embodiments, the opening 204 is formed using a lithography process. In some embodiments, the lithography process includes exposing the second resist layer 110 to a light source, performing post-exposure bake processes, and developing the second resist layer 110. The trim portion 206 is exposed after forming the opening 204, and the trim portion 206 is going to be removed from the first pattern 202 in the following processes.

Method 300 proceeds to step 312 by removing the trim portion 206 of the hard mask layer 106 exposed in the opening 204 to form the trimmed first pattern 208. As shown in FIGS. 7A-7B, the patterned second resist layer 110 including the opening 204 is used as a mask to etch the hard mask layer 106. In some embodiments, the one or more etching processes include a selective dry etch process, such as a plasma etching process, a selective wet etching process, or a combination thereof. During the etching processes, the corresponding portions of the hard mask layer 106 can be selectively etched, while the patterning-target layer 104 remains unetched. After the etching processes, the trim portion 206 is removed to form the trimmed first pattern 208 in the hard mask layer 106. In some embodiments, the second resist layer 110 is then removed by a wet stripping process, a plasma ashing process, and/or other suitable methods.

Method 300 proceeds to step 314 by forming a third resist layer 114 on the patterned hard mask layer 106 as shown in FIGS. 9A-9B. In some embodiments, the third resist layer 114 is formed using a spin-on coating method.

Method 300 proceeds to step 316 by forming a main pattern in the third resist layer 114. In some embodiments, the main pattern includes one or more trenches 210. In some embodiments, the trenches 210 are formed using a lithography process. In some embodiments, the lithography process includes exposing the third resist layer 114 to a light source, performing post-exposure bake processes, and developing the third resist layer 114. The overlapping portion 212 in the hard mask layer 106 is exposed after patterning the third resist layer 114 as shown in FIGS. 10A-10B.

Method 300 proceeds to step 318 by transferring the final pattern to the patterning-target layer 104 as shown in FIGS. 13A-13C. The final pattern includes the main pattern in the patterned third resist layer 114 subtracting the overlapping portion between the main pattern and the trimmed first pattern 208 in the hard mask layer 106. In some embodiments, the patterned third resist layer 114 and the trimmed first pattern 208 are used as masks to etch the patterning-target layer 104 using one or more etching processes. During the etching processes, the corresponding portions of the patterning-target layer 104 can be selectively etched, while the hard mask layer 106 remains unetched.

At step 318 of method 300, in some embodiments, the third resist layer 114 is also removed by a wet stripping process, a plasma ashing process, and/or other suitable methods. In some embodiments, the hard mask layer 106 is removed using a CMP process, or one or more suitable etching processes. The etching processes may include a dry etch process, such as a plasma etching process, a wet etching process, or a combination thereof. During the etching processes, the corresponding portions of the hard mask layer 106 can be selectively etched, while the patterning-target layer 104 remains unetched.

FIGS. 15A-15C to FIGS. 27A-27C and FIG. 28 illustrate some embodiments of the mechanism of forming patterns in a semiconductor structure. As illustrated in FIGS. 15A-15C, a substrate 402 and a film stack 403 are provided in a semiconductor structure 400. In some embodiments, the substrate 402 is a semiconductor substrate, such as a semiconductor wafer. The substrate 402 may include silicon in a crystalline structure. In some embodiments, the substrate 402 may include other elementary semiconductor, such as germanium; a compound semiconductor including silicon germanium, silicon carbide, gallium arsenide, indium arsenide, indium phosphide, and/or indium antimonide; an alloy semiconductor including SiGe, GaAsP, AlInAs, AlGaAs, GaInAs, GaInP, and/or GaInAsP; or combinations thereof. In some embodiments, the substrate 402 may be a silicon-on-insulator (SOI) substrate. The substrate 402 may further include additional features and/or material layers, such as various isolation features formed in the substrate. In some embodiments, the substrate 402 may include various doped regions, such as p-type doped regions and/or n-type doped regions configured and coupled to form various devices and functional features. All doping features may be achieved using a suitable process, such as ion implantation in various steps and techniques. In some embodiments, the substrate 402 may include other features, such as shallow trench isolation (STI). The substrate 402 may further include various material layers, such as gate material layers.

As shown in FIGS. 15B-15C, the film stack 403 includes a patterning-target layer 404 formed over the substrate 402, a hard mask layer 406 over the patterning-target layer 404, and a first resist layer 408 over the hard mask layer 406. In some embodiments, the patterning-target layer 404 is the layer where the final patterns are formed over the substrate 402. In some embodiments, the patterning-target layer 404 has a thickness in a range from about 5 nm to about 50 nm. In some embodiments, the patterning-target layer 404 is formed using one or more conventional processes known in the art such as, chemical vapor deposition (CVD), spin-on methods, sputtering, oxidation, physical vapor deposition (PVD), atomic layer deposition (ALD), atomic layer CVD (ALCVD), thermal oxidation, and/or other suitable processes. In some embodiments, the patterning-target layer 404 includes one or more dielectric materials, such as silicon oxide ($SiO_2$), silicon nitride ($Si_3N_4$), and/or silicon oxynitride (SiON). In some embodiments, the patterning-target layer 404 also includes metallic materials. In some embodiments, the patterning-target layer 404 is an upper portion of the substrate 402.

Still referring to FIGS. 15B-15C, the hard mask layer 406 is formed over the patterning-target layer 404. The hard mask layer 406 is patterned and then used to pattern the patterning-target layer 404 as discussed later in detail in the present disclosure. In some embodiments, the hard mask layer 406 includes a dielectric material, such as silicon oxide, silicon nitride, and/or silicon oxynitride (SiON). In some embodiments, the hard mask layer 406 includes titanium nitride (TiN). In some embodiments, the hard mask layer 406 has a thickness in a range from about 5 nm to about 50 nm. In some embodiments, the hard mask layer 406 is formed using one or more processes selected from the group consisting of CVD, PVD, ALD, spin-on method, sputtering, thermal oxidation, and a combination thereof.

As shown in FIGS. 15A-15C, in order to pattern the hard mask layer 406, so that the patterned hard mask layer 406 can be used as a mask to pattern the patterning-target layer 404, the first resist layer 408 is formed over the hard mask layer 406. In some embodiments, the first resist layer 408 is a photoresist layer including chemicals that are sensitive to light, such as UV light. In some embodiments, the first resist layer 408 can also be an electron-beam sensitive layer. In some embodiments, the first resist layer 408 is formed using a spin-on coating method. In some embodiments, the first resist layer 408 includes one or more organic polymer materials. In some embodiments, the first resist layer 408 has a thickness in a range from about 10 nm to about 100 nm.

Referring to FIGS. 16A-16C, a lithography process is performed to the first resist layer 408 to form a first pattern 502. In some embodiments, the lithography process includes exposing the first resist layer 408 to a light source using a mask including the first pattern 502, performing post-exposure bake processes, and developing the first resist layer 408 to form the first pattern 502 as shown in FIGS. 16A-16C.

Referring to FIGS. 17A-17C, the patterned first resist layer 408 is used as a mask to transfer the first pattern 502 to the hard mask layer 406. In some embodiments, the regions that are not covered by the patterned first resist layer 408 are removed using one or more etching processes, leaving the region(s) corresponding to the first pattern 502 remain in the hard mask layer 406 as shown in FIG. 17B. In some embodiments, the one or more etching processes include a selective dry etch process, such as a plasma etching process, a selective wet etching process, or a combination thereof. During the etching processes, the corresponding portions of the hard mask layer 406 are selectively etched, while the patterning-target layer 404 remains unetched. In some embodiments when the hard mask layer 406 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 406 includes titanium nitride, the etching process includes using an etching gas including at least chlorine ($Cl_2$) or any other suitable etching gases.

Referring to FIGS. 18A-18C, after transferring the first pattern 502 to the hard mask layer 406, the first resist layer 408 is removed. In some embodiments, the first resist layer 408 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 18B, the first pattern 502 in the hard mask layer 406 is exposed. The regions(s) of the hard mask layer 406 that are not corresponding to the first pattern 502 are removed as shown in FIG. 18C.

Referring to FIGS. 19A-19C, a second resist layer 410 is formed over the patterning-target layer 404 and the patterned hard mask 406. In some embodiments, the second resist layer 410 is a photoresist layer including chemicals that are sensitive to light, such as UV light. In some embodiments, the second resist layer 410 can also be an electron-beam sensitive layer. In some embodiments, the second resist layer 410 is formed using a spin-on coating method. In some embodiments, the first resist layer 408 includes one or more organic polymer materials. In some embodiments, the second resist layer 410 has a thickness in a range from about 10 nm to about 100 nm. In some embodiments, the second resist layer 410 is substantially similar to the first resist layer 408.

Referring to FIGS. 20A-20C, a second pattern is formed in the second resist layer 410. In some embodiments, the second pattern includes an opening 504 formed in the second resist layer 410. In some embodiments, the second pattern includes a patch patter 506 formed in a patch layer using the opening 504 as discussed with reference to FIGS. 21A-21C in the present disclosure. In some embodiments, the patch pattern 506 can be formed in a distance less than about a minimum pitch value from an adjacent feature (e.g., the first pattern 502). In some embodiments, the opening 504 is formed using a lithography process. In some embodiments, the lithography process includes exposing the second resist layer 410 to a light source using a mask including a pattern of the opening 504, performing post-exposure bake processes, and developing the second resist layer 410 to form the opening 504 in the second resist layer 410 as shown in FIGS. 20A-20C. In some embodiments as shown in FIGS. 20C and 21C, the opening 504 corresponds to a portion where the patch pattern 506 is to be formed. Although the opening 504 is shown to be parallel to the first pattern 502 in FIG. 20A, the opening 504 can be designed and formed to be perpendicular to the first pattern 502, or in any suitable angle relative to the first pattern 502. In some embodiments, the second pattern may include any other suitable features that can be formed using a lithography process.

Figure 21A:
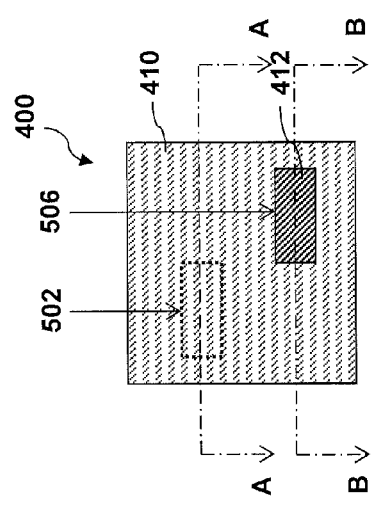
Figure 21B:
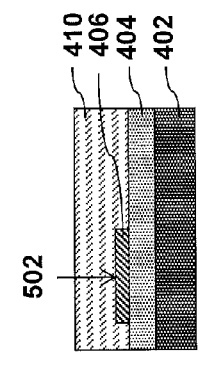
Figure 21C:
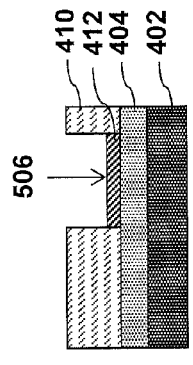

Referring to FIGS. 21A-21C, the patch pattern 506 in a patch layer 412 is formed in the opening 504. In some embodiments, the patch pattern 506 in the patch layer 412 includes one or more dielectric materials that are similar to the materials used for the hard mask layer 406, such as silicon oxide, silicon nitride, and/or silicon oxynitride (SiON). In some embodiments, the patch layer 412 includes titanium nitride (TiN). In some embodiments, the patch layer 412 includes materials that are different from the materials used for the hard mask layer 406. In some embodiments, the patch layer 412 has a thickness in a range from about 5 nm to about 50 nm. In some embodiments, the patch layer 412 is formed using one or more processes selected from the group consisting of CVD, PVD, ALD, spin-on method, sputtering, thermal oxidation, and a combination thereof.

Figure 22A:
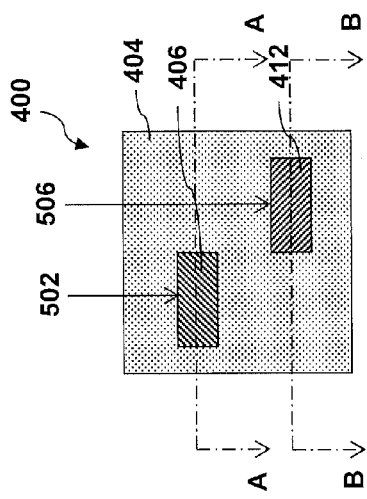
Figure 22B:
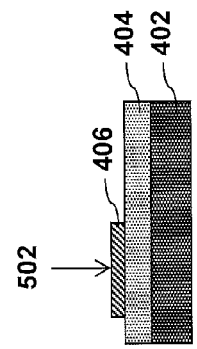
Figure 22C:
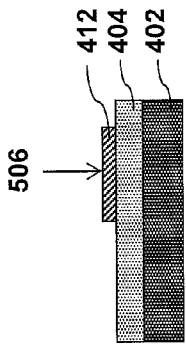

Referring to FIGS. 22A-22C, after forming the patch pattern 506 in the patch layer 412, the second resist layer 410 is removed. In some embodiments, the second resist layer 410 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 22A, after removing the second resist layer 410, the first pattern 502 in the hard mask layer 406 is exposed.

Referring to FIGS. 23A-23C, a third resist layer 414 is formed to cover the patterning-target layer 404, the first pattern 502 in the hard mask layer 406, and the patch pattern 506 in the patch layer 412. In some embodiments, the third resist layer 414 is a photoresist layer including chemicals that are sensitive to light, such as UV light. In some embodiments, the third resist layer 414 can also be an electron-beam sensitive layer. In some embodiments, the third resist layer 414 is formed using a spin-on coating method. In some embodiments, the first resist layer 408 includes one or more organic polymer materials. In some embodiments, the third resist layer 414 has a thickness in a range from about 10 nm to about 100 nm. In some embodiments, the third resist layer 414 is substantially similar to the first resist layer 408.

Referring to FIGS. 24A-24C, a main pattern is formed in the third resist layer 414. In some embodiments, the main pattern includes one or more trenches 508 formed in the third resist layer 414 to expose portions of the first pattern 502 in the hard mask layer 406, portions of the patch pattern 506 in the patch layer 412, and portions of the patterning-target layer 404. In some embodiments, the trenches 508 are formed using a lithography process. In some embodiments, the lithography process starts from exposing the third resist layer 414 to a light source using a mask having the main pattern including the trenches 508. The lithography process also includes performing post-exposure bake processes, and developing the third resist layer 414 to form the trenches 508 in the third resist layer 414 as shown in FIGS. 24A-24C. In some embodiments, the main pattern includes periodical patterns that can be formed using a Direct Self Assembly (DSA) process.

In some embodiments as shown in FIG. 24A, after forming the trenches 508, an overlapping portion 510 in the hard mask layer 406 and an overlapping portion 512 in the patch layer 412 are exposed. In some embodiments, the overlapping portion 510 corresponds to an overlapping portion between the main pattern (e.g., the trenches 508) and the first pattern 502 in the hard mask layer 406 as shown in FIG. 24B. In some embodiments, the overlapping portion 512 corresponds to an overlapping portion between the main pattern (e.g., the trenches 508) and the second pattern (e.g., the patch pattern 506) as shown in FIG. 24C. In some embodiments, the main pattern may include any other suitable features that can be formed using a lithography process.

Figure 25A:
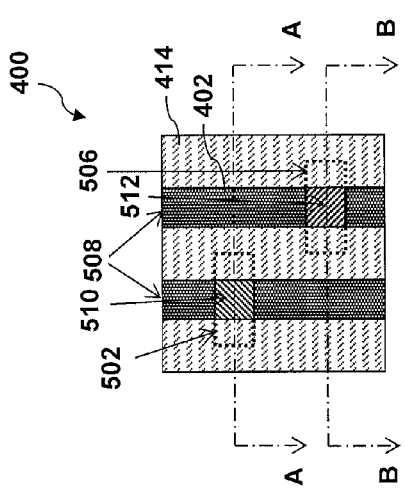
Figure 25B:
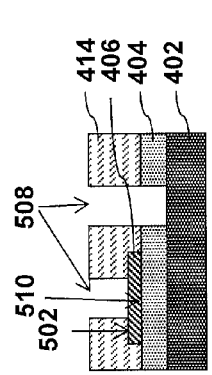
Figure 25C:
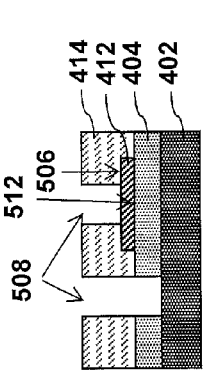

Referring to FIGS. 25A-25C, the patterned third resist layer 414, the overlapping portion 510 in the hard mask layer 406, and the overlapping portion 512 in the patch layer 412 are used as masks to transfer a final pattern to the patterning-target layer 404. In some embodiments, the final pattern includes the one or more trenches 508 in the main pattern, subtracting the overlapping portion 510 in the hard mask layer 406 and the overlapping portion 512 in the patch layer 412. In some embodiments, the regions of the patterning-target layer 404 exposed by the trenches 508 and not covered by the overlapping portion 510 and the overlapping portion 512 are removed using one or more etching processes. The region(s) of the patterning-target layer 404 in the trenches 508 that are covered by the overlapping portion 510 and the overlapping portion 512 remain unetched as shown in FIGS. 25B-25C. In some embodiments, the one or more etching processes include a selective dry etch process, such as a plasma etching process, a selective wet etching process, or a combination thereof, so that the corresponding portions of the patterning-target layer 404 can be selectively etched, while the hard mask layer 406 and the patch layer 412 remain unetched. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof.

Figure 26A:
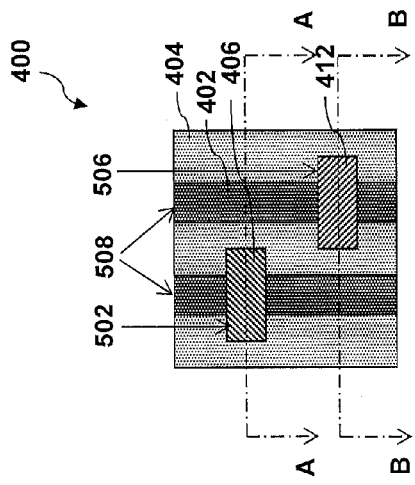
Figure 26B:
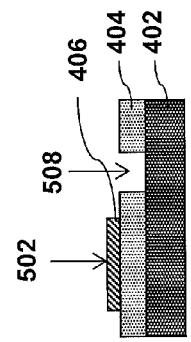
Figure 26C:
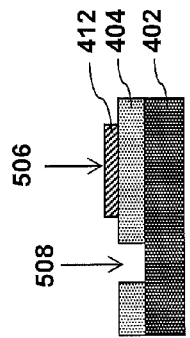

Referring to FIGS. 26A-26C, the third resist layer 414 is removed. In some embodiments, the third resist layer 414 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 26B, after removing the third resist layer 414, the first pattern 502 in the hard mask layer 406 is exposed. As shown in FIG. 26C, the patch pattern 506 in the patch layer 412 is also exposed after removing the third resist layer 414. The first pattern 502 and the patch pattern 506 are disposed over the unetched regions of the patterning-target layer 404 as shown in FIGS. 26A-26C.

Referring to FIGS. 27A-27C, the first pattern 502 in the hard mask layer 406 and the patch pattern 506 in the patch layer 412 are removed. In some embodiments, the hard mask layer 406 and the patch layer 412 are removed using a chemical mechanical polish (CMP) process. In some embodiments, the hard mask layer 406 and the patch layer 412 are removed using one or more etching processes. The etching processes may include a selective dry etch process, such as a plasma etching process, a selective wet etching process, or a combination thereof. During the etching processes, the hard mask layer 406 and the patch layer 412 can be selectively etched, while the patterning-target layer 404 remains unetched. In some embodiments when the hard mask layer 406 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 406 includes titanium nitride, the etching process includes using an etching gas including at least chlorine ($Cl_2$) or any other suitable etching gases.

As shown in FIGS. 27A-27C, the final pattern in the patterning-target layer 404 includes the one or more trenches 508 in the main pattern (M) subtracting the overlapping portion 510 and the overlapping portion 512. In some embodiments as discussed earlier in the present disclosure, the overlapping portion 510 corresponds to the overlapping portion between the main pattern (M) and the first pattern 502 (P1). The overlapping portion 512 corresponds to the overlapping portion between the main pattern (M) and the second pattern (P2) (e.g., the patch pattern 506). Therefore, the formation of the final pattern (F) can be illustrated using Equation 2:

$$F=(M-(M \cap P1))-(M \cap P2) \qquad (2)$$

In some embodiments, by using multiple lithography processes as discussed in the present disclosure, the final pattern may include dense feature(s) that are disposed from an adjacent feature for less than about a minimum pitch value. In some embodiments, the final pattern may include complex shapes and/or large-size shapes which cannot be formed using a single lithography process. In some embodiments, the final pattern has sharp and clear edges and is free of "rounding issues".

Figure 28:
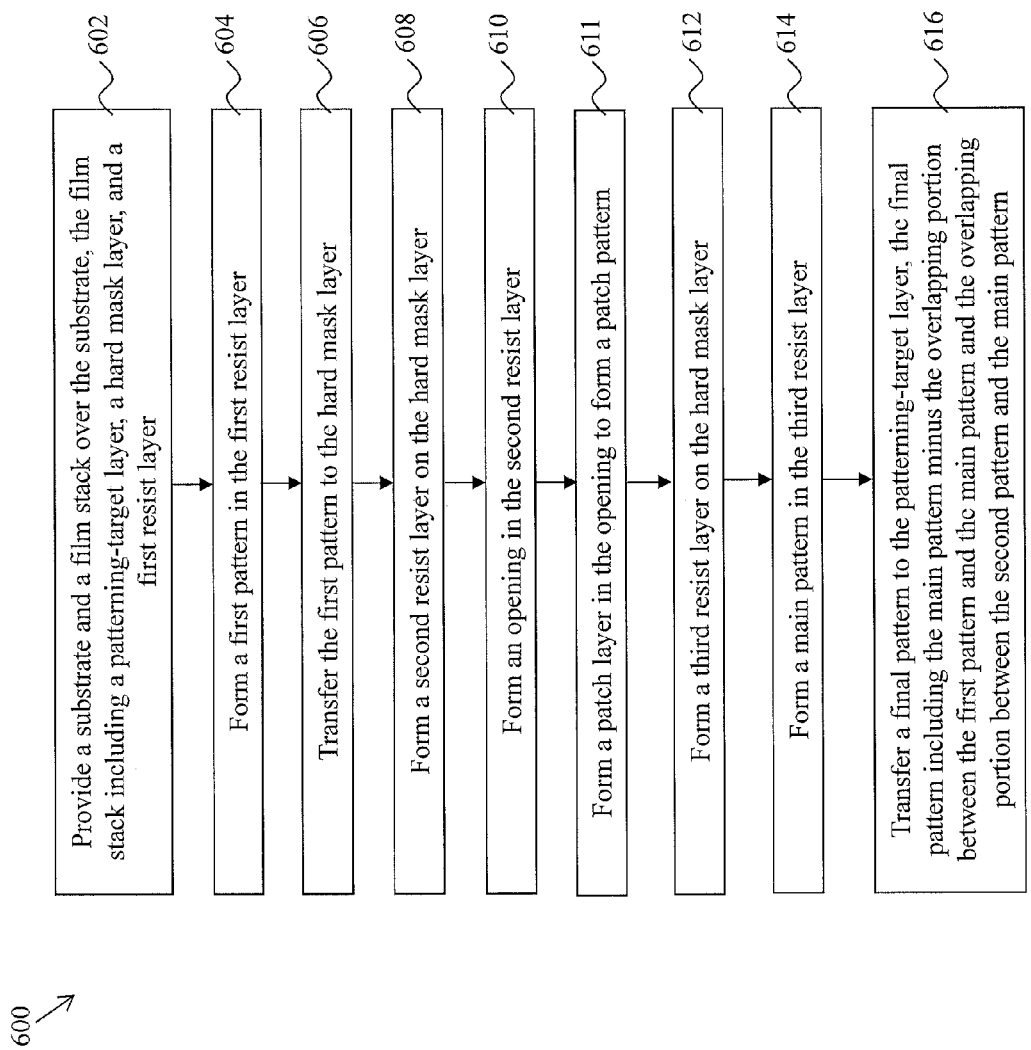
FIG. 28 is a flowchart showing a method of forming patterns using multiple lithography processes in the semiconductor structure, in accordance with some embodiments.

FIG. 28 illustrates a method 600 of forming patterns using multiple lithography processes in the semiconductor structure 400 as discussed with reference to FIGS. 15A-15C to 27A-27C. Method 600 starts from step 602 by providing the substrate 402 and the film stack 403. As shown in FIGS. 15B-15C, the film stack 403 includes the patterning-target layer 404 formed over the substrate 402, the hard mask layer 406 over the patterning-target layer 404, and the first resist layer 408 over the hard mask layer 406. In some embodiments, the patterning-target layer 404 and the hard mask layer 406 are formed by one or more processes selected from the group consisting of CVD, PVD, ALD, spin-on method, sputtering, thermal oxidation, and a combination thereof. In some embodiments, the first resist layer 408 is formed using a spin-on coating method.

Method 600 proceeds to step 604 by forming a first pattern 502 in the first resist layer 408 using a lithography process. In some embodiments, the lithography process includes exposing the first resist layer 408 to a light source, performing post-exposure bake processes, and developing the first resist layer 408.

Method 600 proceeds to step 606 by transferring the first pattern 502 to the hard mask layer 406. In some embodiments, the hard mask layer 406 is etched using the patterned first resist layer 408 as a mask. In some embodiments, the etching processes include a selective dry etch process, such as a plasma etching process, a selective wet etching process, or a combination thereof. During the etching processes, the corresponding portions of the hard mask layer 406 can be selectively etched, while the patterning-target layer 404 remains unetched. In some embodiments, the first resist layer 408 is then removed by a wet stripping process, a plasma ashing process, and/or other suitable methods.

Method 600 proceeds to step 608 by forming a second resist layer 410 on the patterned hard mask layer 406 as shown in FIGS. 19A-19C. In some embodiments, the second resist layer 410 is formed using a spin-on coating method.

Method 600 proceeds to step 610 by forming a second pattern in the second resist layer 410. In some embodiments as shown in FIGS. 20A-20C, the second pattern includes an opening 504. In some embodiments, the opening 504 is formed using a lithography process. In some embodiments, the lithography process includes exposing the second resist layer 410 to a light source, performing post-exposure bake processes, and developing the second resist layer 410.

Method 600 proceeds to step 611 by forming the patch pattern 506 in the trenches 504 in the patch layer 412 as shown in FIGS. 21A-21C. In some embodiments at step 610, the second pattern also includes the patch pattern 506. In some embodiments, the patch pattern 506 is formed using CVD, PVD, ALD, spin-on method, sputtering, thermal oxidation, and/or any other suitable methods.

Method 600 proceeds to step 612 by forming a third resist layer 414 on the patterned hard mask layer 406 as shown in FIGS. 23A-23C. In some embodiments, the third resist layer 414 is formed using a spin-on coating method.

Method 600 proceeds to step 614 by forming a main pattern in the third resist layer 414. In some embodiments, the main pattern includes one or more trenches 508 corresponding to one or more trenches in the main pattern. In some embodiments, the trenches 508 are formed using a lithography process. In some embodiments, the lithography process includes exposing the third resist layer 414 to a light source, performing post-exposure bake processes, and developing the third resist layer 414. The overlapping portion 510 in the hard mask layer 406 and the overlapping portion 512 in the patch layer 412 are exposed after patterning the third resist layer 114 as shown in FIGS. 24A-24C.

Method 600 proceeds to step 616 by transferring the final pattern to the patterning-target layer 404 as shown in FIGS. 25A-25C. In some embodiments, the final pattern includes the main pattern in the patterned third resist layer 414 subtracting the overlapping portion 510 between the first pattern 502 and the main pattern, and the overlapping portion 512 between the second pattern (e.g., patch pattern 506) and the main pattern. In some embodiments, the patterned third resist layer 414, the overlapping portion 510 in the hard mask layer 406, and the overlapping portion 512 in the patch layer 412 are used as masks to etch the patterning-target layer 404 using one or more etching processes. During the etching processes, the corresponding portions of the patterning-target layer 404 can be selectively etched, while the hard mask layer 406 and the patch layer 412 remain unetched.

At step 616 of method 600, in some embodiments, the third resist layer 414 is also removed by a wet stripping process, a plasma ashing process, and/or other suitable methods. In some embodiments at step 616, the hard mask layer 406 and the patch layer 412 are then removed using a CMP process, or one or more suitable etching processes. The etching processes may include a dry etch process, such as a plasma etching process, a wet etching process, or a combination thereof. During the etching processes, the corresponding portions of the hard mask layer 406 and the patch layer 412 can be selectively etched, while the patterning-target layer 404 remains unetched.

The present embodiments describe one or more manufacturable and low-cost mechanisms for forming patterns in semiconductor devices using multiple lithography processes. The mechanisms involve forming a first pattern in the hard mask layer, trimming the first pattern using a second pattern, and forming a final pattern using a main pattern and the trimmed first pattern. The mechanisms also involve forming a first pattern in the hard mask layer, forming a second pattern in a patch layer, and forming a final pattern using a main pattern, the first pattern, and the second pattern. The mechanisms enable forming patterns having a size that can be less than the minimum pitch value. The mechanisms also enable forming patterns in a semiconductor device with large-sized and/or complex shapes that are difficult to form using a single lithography process. The mechanisms also enable forming patterns in a semiconductor device with sharp and clear edges and free of "rounding issues".

The present disclosure provides a method for forming patterns in a semiconductor device. In accordance with some embodiments, the method includes providing a substrate, a patterning-target layer over the substrate, and a hard mask layer over the patterning-target layer; forming a first pattern in the hard mask layer; removing a trim portion from the first pattern in the hard mask layer to form a trimmed first pattern; forming a first resist layer over the hard mask layer; forming a main pattern in the first resist layer; and etching the patterning-target layer using the main pattern and the trimmed first pattern as etching mask elements to form a final pattern in the patterning-target layer. In some embodiments, the final pattern includes the main pattern subtracting a first overlapping portion between the main pattern and the trimmed first pattern.

The present disclosure provides yet another embodiment of a method for forming patterns in a semiconductor device. In accordance with some embodiments, the method includes providing a substrate and a hard mask layer over the substrate; forming a first pattern in the hard mask layer; trimming the first pattern to form a trimmed first pattern in the hard mask layer; forming a first resist layer over the hard mask layer; forming a main pattern in the first resist layer, the main pattern being overlapped with the trimmed first pattern; and performing an etch process using the main pattern and the trimmed first pattern as etching mask elements to form a final pattern.

The present disclosure provides yet another embodiment of a method for forming patterns in a semiconductor device. In accordance with some embodiments, the method includes providing a substrate, a patterning-target layer over the substrate, and a hard mask layer over the patterning-target layer; forming a first pattern in the hard mask layer; forming a first resist layer over the hard mask layer; forming an opening in the first resist layer; forming a patch layer in the opening; forming a second resist layer over the hard mask layer and the patch layer; forming a main pattern in the second resist layer; and etching the patterning-target layer using the main pattern, the first pattern and the patch pattern as etching mask elements to form a final pattern. In some embodiments, the final pattern includes the main pattern subtracting a first overlapping portion between the main pattern and the first pattern and a second overlapping portion between the main pattern and the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming patterns in a semiconductor device, the method comprising:
    providing a substrate, a patterning-target layer over the substrate, and a hard mask layer over the patterning-target layer;
    forming a first pattern in the hard mask layer;
    removing a trim portion from the first pattern in the hard mask layer to form a trimmed first pattern;
    forming a first resist layer over the hard mask layer;
    forming a main pattern in the first resist layer; and
    etching the patterning-target layer using the main pattern and the trimmed first pattern as etching mask elements to form a final pattern in the patterning-target layer,
    wherein the final pattern includes the main pattern subtracting a first overlapping portion between the main pattern and the trimmed first pattern.

2. The method of claim 1, wherein forming the first pattern includes:
    forming a second resist layer over the hard mask layer;
    forming the first pattern in the second resist layer; and
    etching the hard mask layer using the second resist layer as an etching mask to form the first pattern in the hard mask layer.

3. The method of claim 1, wherein removing the trim portion from the first pattern in the hard mask includes:
    forming a third resist layer over the hard mask layer;
    forming an opening in the third resist layer; and
    etching the first pattern in the hard mask layer using the patterned third resist layer as an etching mask,
    wherein the trim portion is a second overlapping portion between the first pattern and the opening being exposed after forming the opening.

4. The method of claim 1, wherein a size of the trimmed first pattern is less than a pitch value.

5. The method of claim 1, wherein the main pattern includes one or more trenches.

6. The method of claim 1, wherein the patterning-target layer has a thickness in a range from about 5 nm to about 50 nm.

7. The method of claim 1, wherein etching the patterning-target layer includes using one or more etching gases selected from the group consisting of carbon tetrafluoride ($CF_4$), difluoromethane ($CH_2F_2$), and trifluoromethane ($CHF_3$).

8. The method of claim 1, further comprising:
    removing the first resist layer using one or more processes selected from the group consisting of a wet stripping process, a plasma ashing process, and a combination thereof.

9. The method of claim 8, wherein the plasma ashing process includes using one or more gases selected from the group consisting of oxygen ($O_2$), carbon dioxide ($CO_2$), nitrogen ($N_2$), hydrogen ($H_2$), and a combination thereof.

10. A method for forming patterns in a semiconductor device, the method comprising:
    providing a substrate and a hard mask layer over the substrate;
    forming a first pattern in the hard mask layer;
    trimming the first pattern to form a trimmed first pattern in the hard mask layer;
    forming a first resist layer over the hard mask layer;
    forming a main pattern in the first resist layer, the main pattern being overlapped with the trimmed first pattern; and
    performing an etch process using the main pattern and the trimmed first pattern as etching mask elements to form a final pattern.

11. The method of claim 10, wherein trimming the first pattern includes:
forming a second resist layer over the hard mask layer;
forming an opening in the second resist layer; and
etching the hard mask layer using the second resist layer as an etching mask to form the trimmed first pattern,
wherein the opening exposes a portion of the first pattern in the hard mask layer.

12. The method of claim 10, wherein the final pattern includes the main pattern subtracting an overlapping portion between the main pattern and the trimmed first pattern:

$$F=M-(M\cap(P1-(P1\cap P2))),$$

where F is the final pattern, M is the main pattern, P1 is the first pattern, and P2 is the second pattern.

13. The method of claim 10, further comprising:
providing a patterning-target layer between the substrate and the hard mask layer; and
performing the etching process to form the final pattern in the patterning-target layer.

14. A method for forming patterns in a semiconductor device, the method comprising:
providing a substrate, a patterning-target layer over the substrate, and a hard mask layer over the patterning-target layer;
forming a first pattern in the hard mask layer;
forming a first resist layer over the hard mask layer;
forming an opening in the first resist layer;
forming a patch layer in the opening;
forming a second resist layer over the hard mask layer and the patch layer;
forming a main pattern in the second resist layer; and
etching the patterning-target layer using the main pattern, the first pattern and the patch pattern as etching mask elements to form a final pattern,
wherein the final pattern includes the main pattern subtracting a first overlapping portion between the main pattern and the first pattern and a second overlapping portion between the main pattern and the opening.

15. The method of claim 14, wherein forming the first pattern includes:
forming a third resist layer over the hard mask layer;
forming the first pattern in the third resist layer; and
etching the hard mask layer using the third resist layer as an etch mask to form the first pattern in the hard mask layer.

16. The method of claim 14, wherein the patch layer includes one or more dielectric materials selected from the group consisting of silicon oxide, silicon nitride, silicon oxynitride (SiON), titanium nitride (TiN), and a combination thereof.

17. The method of claim 14, wherein the main pattern includes one or more trenches.

18. The method of claim 14, wherein the patch pattern is disposed at a distance less than about a minimum pitch value from the first pattern.

19. The method of claim 14, wherein the patterning-target layer has a thickness in a range from about 5 nm to about 50 nm.

20. The method of claim 14, wherein etching the patterning-target layer includes using one or more etching gases selected from the group consisting of carbon tetrafluoride ($CF_4$), difluoromethane ($CH_2F_2$), and trifluoromethane ($CHF_3$).

* * * * *